(12) United States Patent
Elberson

(10) Patent No.: US 8,143,518 B2
(45) Date of Patent: Mar. 27, 2012

(54) ELECTRICAL BOX WITH HINGEDLY ATTACHED LID

(75) Inventor: Thomas L. Elberson, Defiance, OH (US)

(73) Assignee: Allied Moulded Products, Inc., Bryan, OH (US)

( * ) Notice: Subject to any disclaimer, the term of this patent is extended or adjusted under 35 U.S.C. 154(b) by 563 days.

(21) Appl. No.: 12/350,657

(22) Filed: Jan. 8, 2009

(65) Prior Publication Data

US 2009/0173512 A1  Jul. 9, 2009

Related U.S. Application Data

(60) Provisional application No. 61/019,985, filed on Jan. 9, 2008.

(51) Int. Cl.
*H05K 5/00* (2006.01)

(52) U.S. Cl. ............. 174/50; 174/66; 439/535; 248/906

(58) Field of Classification Search ............ 174/50, 174/66, 67; 439/535, 135, 136; 220/4.02, 220/241, 242
See application file for complete search history.

(56) References Cited

U.S. PATENT DOCUMENTS

| | | |
|---|---|---|
| 3,622,029 A | 11/1971 | Ware |
| 3,690,501 A | 9/1972 | Ware |
| 3,701,451 A | 10/1972 | Schindler et al. |
| 3,862,351 A | 1/1975 | Schindler et al. |
| 3,891,113 A | 6/1975 | Salg |
| RE28,489 E | 7/1975 | Schindler et al. |
| 3,917,101 A | 11/1975 | Ware |
| 3,927,785 A | 12/1975 | Kinney et al. |
| 3,980,197 A | 9/1976 | Ware |
| 4,176,759 A | 12/1979 | Nattel |
| 4,202,457 A | 5/1980 | Tansi |
| 4,698,459 A * | 10/1987 | Drake .................. 174/138 F |
| 4,915,638 A * | 4/1990 | Domian .................. 439/142 |
| 5,317,108 A * | 5/1994 | Prairie, Jr. .................. 174/67 |
| 5,596,174 A | 1/1997 | Sapienza |
| 5,710,392 A | 1/1998 | Bordwell et al. |
| 5,717,164 A | 2/1998 | Shetterly |
| 5,800,028 A * | 9/1998 | Smith et al. ................. 312/223.1 |
| 5,834,692 A | 11/1998 | Lentz |
| 5,904,260 A | 5/1999 | Bauer et al. |
| 6,242,696 B1 | 6/2001 | Reiker |
| 6,353,183 B1 * | 3/2002 | Ott et al. .................. 174/59 |
| 6,727,428 B2 | 4/2004 | Archer et al. |
| 6,831,227 B2 | 12/2004 | Weise et al. |
| 6,946,602 B1 * | 9/2005 | Gibbs et al. .................. 174/560 |
| 6,979,783 B2 | 12/2005 | Weise et al. |
| 7,087,836 B2 | 8/2006 | Archer et al. |
| 7,145,077 B2 | 12/2006 | Weise et al. |
| 7,151,672 B2 * | 12/2006 | Campbell .................. 361/725 |
| 7,214,875 B1 | 5/2007 | Gretz |
| 7,227,085 B1 | 6/2007 | Gretz |
| 7,284,673 B2 * | 10/2007 | Habeger et al. ............. 220/4.23 |
| 7,431,594 B2 * | 10/2008 | Castaldo et al. ............. 439/135 |
| 7,795,533 B2 * | 9/2010 | Bravo et al. .................. 174/50 |

(Continued)

*Primary Examiner* — Dhirubhai R Patel

(74) *Attorney, Agent, or Firm* — Fraser Clemmens; Martin & Miller LLC; J. Douglas Miller

(57) ABSTRACT

An electrical box is disclosed, wherein the electrical box includes a lid hingedly attached to a back wall of the electrical box. The lid is adapted to be selectively moved between an open and a closed position, wherein the lid covers at least a portion of an opening into the interior of the electrical box when in the closed position.

16 Claims, 3 Drawing Sheets

U.S. PATENT DOCUMENTS 7,956,284 B2 * 6/2011 Bravo et al. .................... 174/50
2006/0076348 A1 4/2006 Michaud
2006/0108362 A1 5/2006 Lalancette

* cited by examiner

ELECTRICAL BOX WITH HINGEDLY ATTACHED LID

CROSS-REFERENCE TO RELATED APPLICATION

This application claims the benefit of U.S. Provisional Patent Application Ser. No. 61/019,985 filed on Jan. 9, 2008.

FIELD OF THE INVENTION

The present invention relates to an electrical box and more particularly to an electrical box having a hingedly attached lid that covers a portion of an opening to the interior of the box when in a closed position.

BACKGROUND OF THE INVENTION

Typically, an electrical box is used to support and contain electrical devices and wiring in a convenient manner. The electrical box protects the wiring and electrical devices contained therein. A cover plate is typically provided to protect the wiring and associated electrical devices to militate against accidental electrocution of a user. The box is typically connected to a joist or other structural component of a building.

The typical electric box has an industry standard opening on one side to receive a standard electrical device such as a receptacle or a switch, for example. A box configured to receive one such electrical device is commonly referred to as a single-gang or standard size electrical box. In some instances, the interior space of the electrical box is not sufficiently large to receive the electrical device and the wiring connected thereto; or the limited interior space of the box creates difficulty for a technician to complete the wiring connections and attach the electrical device to the box.

Prior art electrical boxes such as those illustrated in U.S. Pat. No. 3,917,101 to Ware, U.S. Pat. No. 3,927,785 to Kinney et al., and U.S. Pat. No. 5,904,260 to Bauer include a lateral portion extending from one side of the box to provide additional interior space to house the electrical device and the wiring connected thereto. Such prior art boxes typically include a lid adapted to cover the opening to the lateral portion of the box. However, the prior art electrical boxes either do not provide a lid integrally attached to the box, which causes inefficiency in the inventorying and the installation of the box; or the lid is attached to the box in a manner that restricts access to the interior space of the box which impedes the technician from efficiently completing the required wiring connections.

It would be desirable to produce an electrical box including a lateral portion and a lid therefore which facilitates the installation of an electrical device and the completion of associated electrical connections within the electrical box.

SUMMARY OF THE INVENTION

Compatible and attuned with the present invention, an electrical box including a lateral portion and a lid therefore which facilitates the installation of an electrical device and the completion of associated electrical connections within the electrical box, has surprisingly been discovered.

In one embodiment, an electrical box comprises a back wall having an inner surface and a coextensive outer surface; a side wall extending outwardly from the inner surface of the back wall; and a lid hingedly attached to the back wall adapted to selectively move from an open position to a closed position, wherein the lid cooperates with the back wall and the side wall to define an interior space of the electrical box and an opening into the interior of the electrical box.

In another embodiment, an electrical box comprises a back wall having an inner surface and a coextensive outer surface; a side wall extending outwardly from the inner surface of the back wall; a wall section extending outwardly from the side wall; a lid hingedly attached to the back wall adapted to selectively move from an open position to a closed position, wherein the lid cooperates with the back wall and the side wall to define an interior space of the electrical box and an opening into the interior of the electrical box; and means to secure the lid in the closed position.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DETAILED DESCRIPTION OF THE PREFERRED EMBODIMENT

Figure 1:
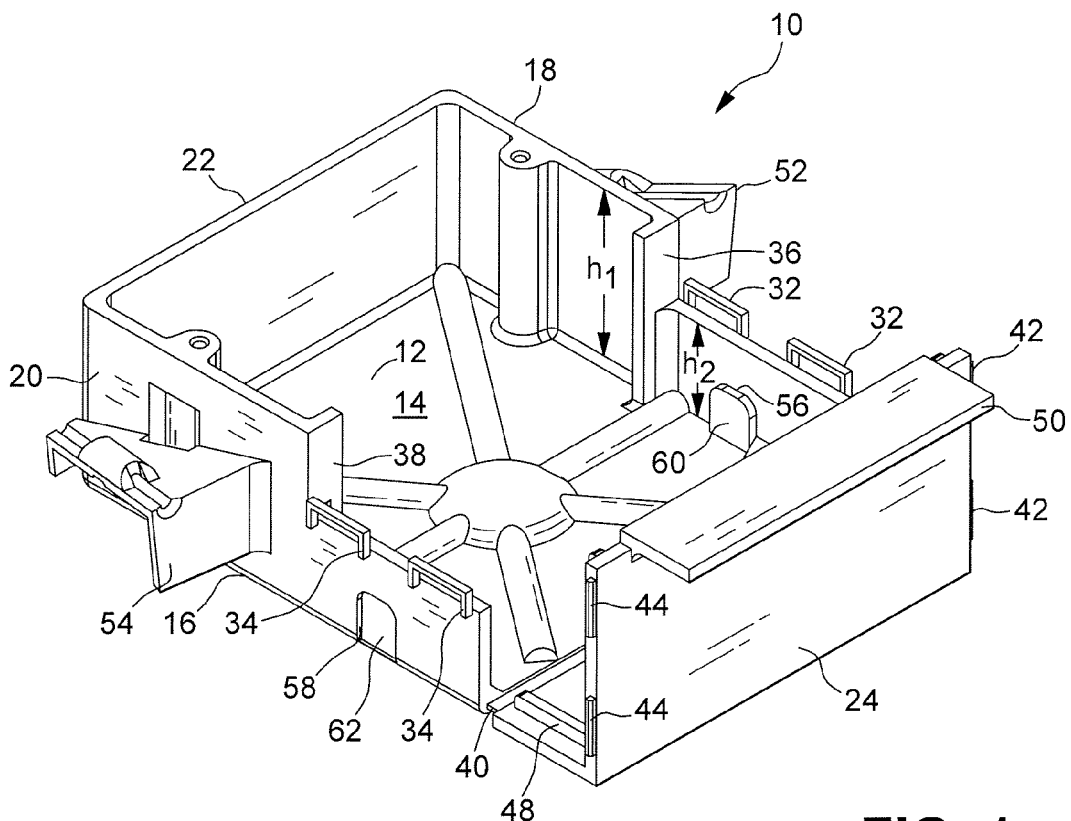
FIG. 1 is a perspective view of an electrical box according to an embodiment of the invention showing a lid in an open position.
Figure 2:
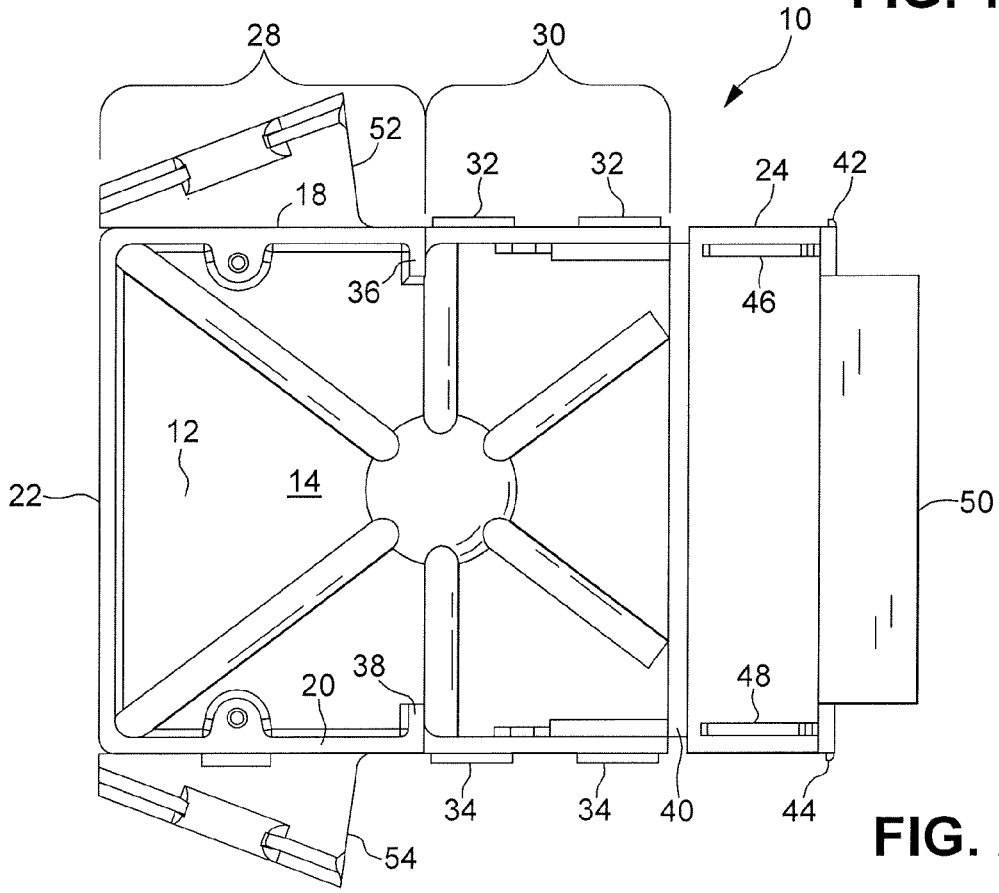
FIG. 2 is a top plan view of the electrical box illustrated in FIG. 1.
Figure 3:
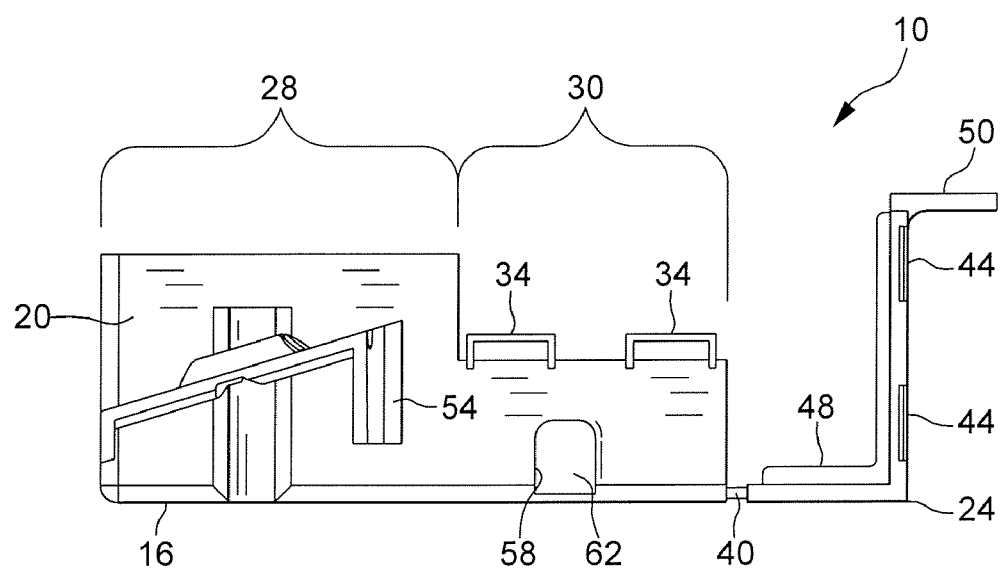
FIG. 3 is a side elevational view of the electrical box illustrated in FIG. 1.
Figure 4:
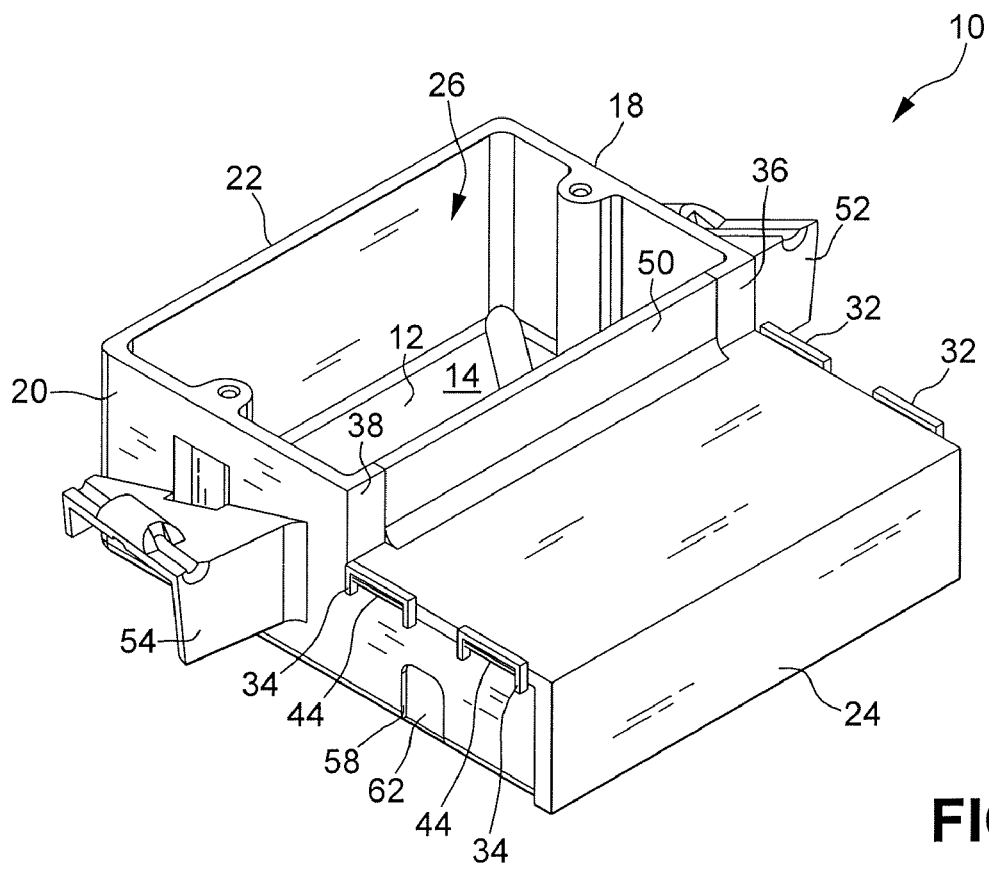
FIG. 4 is a perspective view of the electrical box illustrated in FIGS. 1-3 showing the lid in a closed position.

The following detailed description and appended drawings describe and illustrate various exemplary embodiments of the invention. The description and drawings serve to enable one skilled in the art to make and use the invention, and are not intended to limit the scope of the invention in any manner.

FIGS. 1-4 illustrate an electrical box 10 according to an embodiment of the invention. The electrical box 10 includes a back wall 12 having an inner surface 14 and a coextensive outer surface 16. A pair of opposing side walls 18, 20, and a side wall 22 extend outwardly from the inner surface 14 of the back wall 12 adjacent the peripheral edge thereof. The side walls 18, 20, 22 form a wall extending from three peripheral edges of the back wall 12. A lid 24 is hingedly attached to the fourth peripheral edge of the back wall 12 opposite the side wall 22. The back wall 12, the side walls 18, 20, 22, and the lid 24 cooperate to define an interior space of the electrical box 10 having an opening 26 communicating with the interior space. In the illustrated embodiment the back wall 12, the side walls 18, 20, 22, and the lid 24 form a generally rectangularly shaped electrical box. It should be understood that the back wall 12, the side walls 18, 20, 22, and the lid 24 can have other configurations, as desired, to provide alternate overall shapes to the electrical box 10.

The side walls 18, 20 have a stepped configuration. The height of the side walls 18, 20 changes from a first height $h_1$ adjacent the side wall 22 to a lesser height $h_2$ adjacent the lid 24. The first height $h_1$ is substantially equivalent to a height of the side wall 22. The side wall 22 and the portions of the side walls 18, 20 having the first height $h_1$ define a main portion 28 of the electrical box 10. The opening 26 in the main portion 28 is sized to correspond to a standard sized opening in a single-gang electrical box. It should be understood that the opening 26 can be sized to correspond to other standard sized openings in electrical boxes such as a double-gang box, for example.

The portions of the side walls 18, 20 having the second height $h_2$ define a laterally extended portion 30 of the electrical box 10. The laterally extended portion 30 provides additional interior space to the electrical box 10. The difference between the first height $h_1$ and second height $h_2$ can be selected, as desired. The difference between the first height $h_1$ and the second height $h_2$ in the illustrated embodiment represents a thickness of a wallboard (not shown) that would be disposed over the closed lid 18 to position one surface of the wallboard in a substantially coplanar position in respect of the opening 26. It should be understood that the electrical box 10 can be formed having the first height $h_1$ and second height $h_2$ substantially equivalent.

A pair of latches 32, 34 is formed on the outer surface of each respective side wall 18, 20 adjacent an upper edge thereof. In the illustrated embodiment, the latches 32, 34 are generally u-shaped members. It should be understood that the latches 32, 34 can have other shapes as desired.

Wall sections 36, 38 extend outwardly from the sidewalls 18, 20, respectively. The wall sections 36, 38 are formed at the point of transition from the first height h1 to the second height h2 of the side walls 18, 20. In the illustrated embodiment, the wall sections 36, 38 extend from the upper edge of the side walls 18, 20 to the back wall 12. It should be understood that the wall sections 36, 38 can be formed to extend from the upper edge of the side walls 20, 22 to a selected point between the upper edge of the side walls 20, 22 and the back wall 12.

A living hinge 40 is provided to pivotally attach the lid 24 to the back wall 12. The lid 24 forms a cover for the laterally extended portion 30 of the electrical box 10. The lid 24 includes a pair of locking tabs 42, 44 formed on opposing edges of the lid 24. The locking tabs are adapted to be removably received by the respective latches 32, 34 to secure the lid 18 in the closed position.

Aligning ribs 46, 48 are formed on an inner surface of the lid 18 adjacent opposing edges thereof. The aligning ribs 46, 48 align the lid 24 with the respective side walls 18, 20 to facilitate the locking tabs 42, 44 being received by the latches 32, 34 formed on the side walls 18, 20. An upstanding wall member 50 is formed at an edge of the lid opposite the hinge 40. The wall member 50 is received between the wall sections 36, 38 when the lid 24 is in the closed position.

Attachment wings 52, 54 extend outwardly from the side walls 18, 20 of the box 10, respectively. The attachment wings 52, 54 are adapted to receive a fastener such as a nail or a screw, for example, for attachment to an adjacent support such as a wall stud, for example. It should be understood that other means of attaching the electrical box to the support can be formed in or attached to the electrical box.

Apertures 56, 58 are formed in the side walls 18, 20, respectively, at the laterally extended portion 30 of the electrical box 10. The apertures 56, 58 provide for the passage of electrical wires to the interior space of the electrical box 10. It should be understood that additional apertures can be formed in the back wall 12, and the side wall 18, 20, 22. Knock-out covers 60, 62 are formed to substantially cover the apertures 56, 58, respectively. The knock-out covers 60, 62 can be selectively removed or knocked off the electrical box 10, or the knock-out covers 60, 62 can be selectively pushed over or folded over to allow electrical wires to pass through the respective apertures 56, 58.

Figure 5:
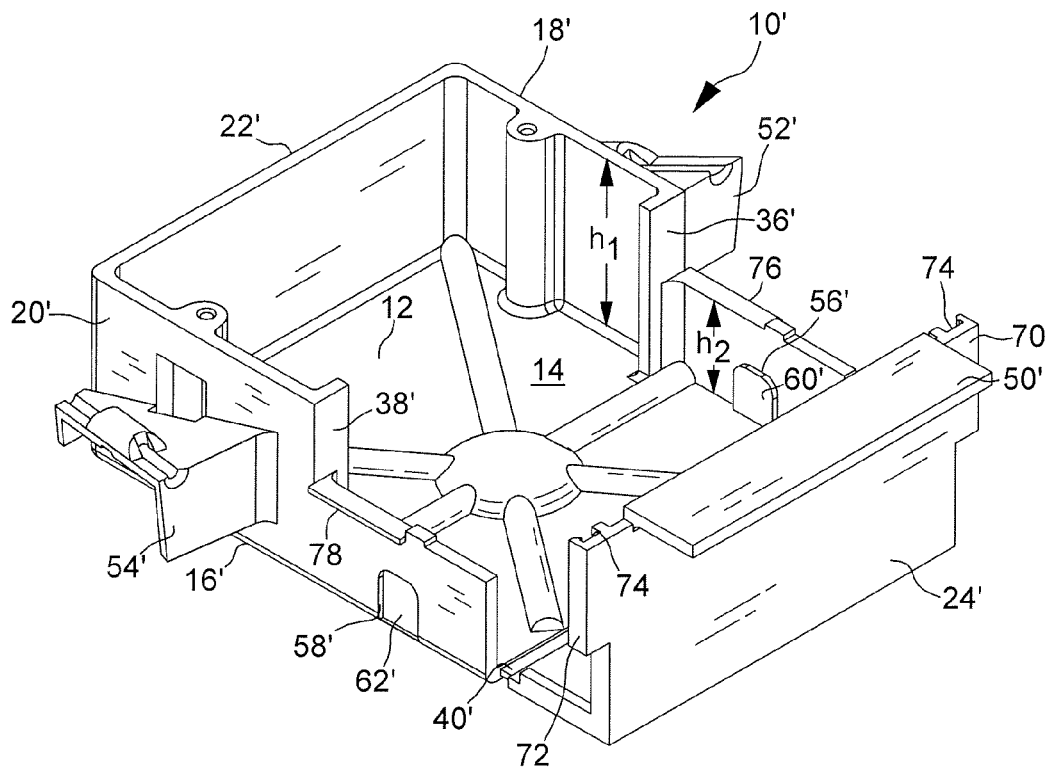
FIG. 5 is a perspective view of an electrical box according to another embodiment of the invention showing a lid in an open position.
Figure 6:
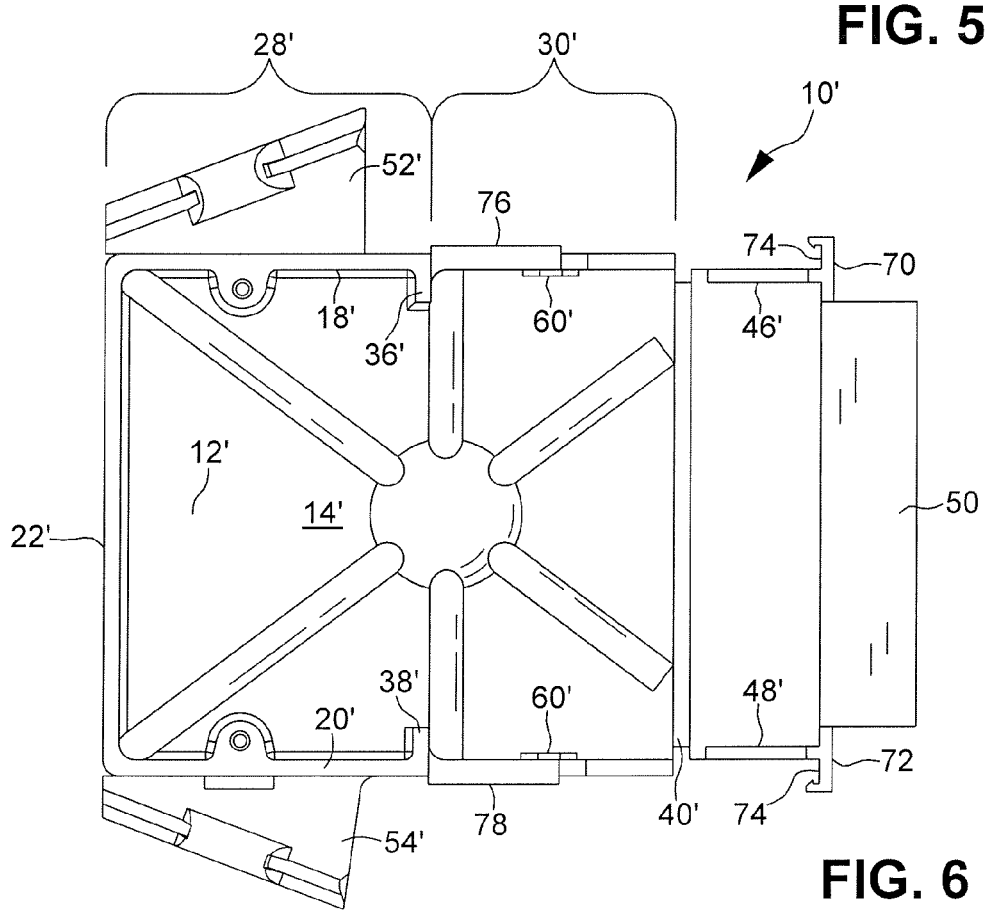
FIG. 6 is a top plan view of the electrical box illustrated in FIG. 5.

FIGS. 5-6 illustrate an alternative embodiment of the electrical box 10. Structure similar to that illustrated in FIG. 1 includes the same reference numeral and a prime (') symbol for clarity. In FIGS. 5-6, the lid 24' is secured in the closed position employing elongate locking members 70, 72 formed at opposite edges of the lid 24'. The elongate locking members 70, 72 have a generally U-shaped cross-sectional forming a channel 74 therebetween. Elongate protuberances 76, 78 are formed on the outer surfaces of each side wall 18', 20'. The elongate protuberances are adapted to be removably received in the channel 78 of the locking members 70, 72 to secure the lid 24' in the closed position. It should be understood that other means can be provided to secure the lid 24 in the closed position. The remaining structure of the electrical box illustrated in FIGS. 5-6 is substantially the same as described above for the embodiment illustrated in FIGS. 1-4.

Favorable results have been obtained by forming the electrical box 10 from fiberglass reinforced polyester or polyvinyl chloride employing an injection molding process. It should be understood that the electrical box 10 can be formed from other materials and with other manufacturing processes such as forming the electrical box from metal employing a metal stamping process, for example.

In use, a technician typically secures the electrical box 10 to a support member such as a wall stud, for example. The attachment of the electrical box 10 is achieved by inserting a fastener such as a nail, for example, through each of the attachment wings 52, 54 and causing the fasteners to penetrate the support member. At this point, the lid 24 is in the open position, as illustrated in FIGS. 1-3, and 5-6, to provide ready access to the interior space of the electrical box 10.

After the electrical box 10 is secured to the support member, one or more knock-out covers 60, 62 can be removed from the electrical box 10 to allow electrical wires to be passed through the apertures 56, 58 and be received within the interior space of the electrical box 10. The necessary connections between the electrical wires and the electrical device to be housed within the electrical box are then completed.

After the necessary electrical connections are made, the wires can be positioned within the interior space of the electrical box 10 to allow the electrical device to be properly positioned in and secured to the electrical box 10. The lid 24 is then moved to the closed position causing the locking tabs 42, 44 to be received by the respective latches 32, 34. If necessary, the lid 24 can be returned to the open position by causing the locking tabs 42, 44 to disengage the latches 32, 34.

The invention provides an expanded interior space to the electrical box 10 to facilitate the housing of the electrical device and electrical wires connected thereto. The lid 24, being hingedly attached to the back wall 12 provides increased access to the laterally extended portion 30 of the electrical box 10 as compared to prior art laterally extended electrical boxes. Accordingly, the difficulty and the time required to complete electrical connections between the electrical device and the associated electrical wires, and secure the electrical device to the electrical box 10 are minimized.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. An electrical box comprising:
   a back wall having an inner surface and a coextensive outer surface;
   a plurality of side walls extending outwardly from the inner surface of the back wall;
   a lid hingedly attached to the back wall selectively movable from an open position to a closed position, wherein the lid cooperates with the side walls to form an outer wall circumscribing a periphery of the back wall, and wherein the lid cooperates with the back wall and the side walls to define an interior space of the electrical box and an opening into the interior of the electrical box; and
   a wall section extending outwardly from at least one of the side walls into the interior space of the electrical box.

2. The electrical box according to claim 1, including means to secure the lid in the closed position.

3. The electrical box according to claim 2, wherein the means to secure the lid includes a latch formed on at least one of the side walls and a tab formed on the lid removably received by the latch.

4. The electrical box according to claim 2, wherein the means to secure the lid includes a protuberance formed on at least one of the side walls and a locking member formed on the lid to removably receive the protuberance.

5. The electrical box according to claim 4, wherein the locking member includes a channel to removably receive the protuberance.

6. The electrical box according to claim 1, wherein the lid includes an upstanding wall section.

7. The electrical box according to claim 6, wherein the upstanding wall section of the lid is received between the wall sections of the side walls; the side walls, the wall sections of the side walls, and the upstanding wall section of the lid defining the opening into the interior space of the electrical box when the lid is in the closed position.

8. The electrical box according to claim 1, including a living hinge interconnecting the lid to the back wall.

9. The electrical box according to claim 1, wherein the electrical box is formed of one of a fiber glass reinforced polyester, a polyvinyl chloride, and a metal.

10. An electrical box comprising:
    a back wall having an inner surface and a coextensive outer surface;
    a plurality of side walls extending outwardly from the inner surface of the back wall;
    a wall section extending outwardly from at least one of the side walls;
    a lid hingedly attached to the back wall selectively movable from an open position to a closed position, wherein the lid cooperates with the side walls to form an outer wall circumscribing a periphery of the back wall, and wherein the lid cooperates with the back wall and the side walls to define an interior space of the electrical box and an opening into the interior of the electrical box; and
    means to secure the lid in the closed position.

11. The electrical box according to claim 10, wherein the lid includes an upstanding wall section.

12. The electrical box according to claim 11, wherein the upstanding wall section of the lid is received between the wall sections of the side walls; the side walls, the wall sections of the side walls, and the upstanding wall section of the lid defining the opening into the interior space of the electrical box when the lid is in the closed position.

13. The electrical box according to claim 10, wherein the means to secure the lid includes a latch formed on at least one of the side walls and a tab formed on the lid removably received by the latch.

14. The electrical box according to claim 10, wherein the means to secure the lid includes a protuberance formed on at least one of the side walls and a locking member formed on the lid to removably receive the protuberance.

15. The electrical box according to claim 14, wherein the locking member includes a channel to removably receive the protuberance.

16. The electrical box according to claim 10, including a living hinge interconnecting the lid to the back wall.

* * * * *